United States Patent [19]
Trost et al.

[11] Patent Number: 5,784,925
[45] Date of Patent: Jul. 28, 1998

[54] VACUUM COMPATIBLE LINEAR MOTION DEVICE

[75] Inventors: David Trost, San Francisco; Lee Veneklasen, Castro Valley, both of Calif.

[73] Assignee: Etec Systems, Inc., Hayward, Calif.

[21] Appl. No.: 766,271

[22] Filed: Dec. 13, 1996

[51] Int. Cl.$^6$ ............ G05G 11/00; F16C 33/06; F16J 15/52
[52] U.S. Cl. .......... 74/490.09; 74/18.2; 250/442.11; 250/492.2; 277/3; 277/212 FB; 384/12
[58] Field of Search ............ 74/18.2, 490.08, 74/490.09; 250/442.11, 492.2; 277/3, 212 FB; 384/12

[56] References Cited

U.S. PATENT DOCUMENTS

| | | | |
|---|---|---|---|
| 4,058,018 | 11/1977 | Lauper | 74/18.2 |
| 4,417,770 | 11/1983 | Tucker | 384/12 |
| 4,462,580 | 7/1984 | Nielsen | 269/73 |
| 4,961,273 | 10/1990 | Fay | 74/18.2 X |
| 5,218,896 | 6/1993 | Furukawa | 91/419 |
| 5,346,513 | 9/1994 | Taniguchi et al. | 29/25.01 |

*Primary Examiner*—Allan D. Herrmann
*Attorney, Agent, or Firm*—Skjerven, Morrill, MacPherson, Franklin & Friel LLP; Bernard Berman

[57] ABSTRACT

A vacuum compatible linear motion device having a fluid bearing is contained within a vacuum chamber having a working pressure of significantly less than one atmosphere. The fluid bearing is contained within a vacuum enclosure within the vacuum chamber and is maintained at a pressure higher than that of the vacuum chamber but less than one atmosphere, thus essentially isolating the fluid bearing. A moveable payload is coupled to the linear motion device such that linear motion in the direction of the long axis of the device is provided to the moveable payload.

42 Claims, 4 Drawing Sheets

VACUUM COMPATIBLE LINEAR MOTION DEVICE

BACKGROUND

1. Field of the Invention

This invention relates to electron beam exposure systems and more specifically to a vacuum compatible linear motion device for an electron beam exposure system.

2. Description of the Prior Art

Electron beam exposure systems, used for example to pattern masks for the semiconductor industry, require a very high precision linear motion device or stage to position a working piece relative to the electron beam. Typical requirements for this device or stage are straightness of travel in pitch, roll and yaw of 2 arc seconds or better, and vibration levels that are less than one thousandth of a gravity (m-g). Two approaches to meeting these requirements are known and used. A first uses hydrostatic fluid film bearings, a second rolling element bearings.

A linear fluid bearing typically consists of a rod and a collar that can traverse a long axis of the rod. Almost frictionless motion can be obtained by providing a bearing support fluid between the rod and collar. Typically, pressurized air is used as this bearing support fluid. Air is of course readily available, easy to clean, both prior and after use, and can be vented safely to the environment, without the need to collect or recycle.

On the other hand, a rolling element bearing (REB) has a rolling element, typically balls or rollers, that essentially replaces the fluid of the fluid bearing. This rolling element requires lubrication, and while only a small amount of lubricant is needed, the lubricant is a potential source of contamination.

In atmospheric applications, for example optical microlithography, fluid bearings or hydrostatic fluid film bearings (HFFB's) are typically selected over REB's despite a higher cost due primarily to providing a pressurized fluid and the venting thereof. This choice is primarily due to HFFB's better performance with regard to the travel and vibration requirements discussed above In a vacuum however, especially the high vacuum required by electron beam exposure systems ($1 \times 10^{-5}$ to $1 \times 10^{-7}$ torr), the use of air, or any fluid, as the bearing support fluid becomes significantly more difficult than at atmospheric pressure due to the need to vent the fluid without affecting the vacuum integrity. As a result, most manufacturers of electron beam exposure systems use roller element bearings. Thus accepting lower performance and a significant risk of contamination.

One manufacturer, Etec Systems, Inc., of Hayward, Calif. uses HFFB's in its MEBES-4500 electron beam patterning system. The solution to venting the HFFB's used involves fabricating a stage having a chuck, or payload, in high vacuum and a bearing portion in atmosphere. Separation of vacuum and atmosphere is accomplished through the use of flexible metal bellows. A simplified sectional view of this solution is shown in FIG. 1.

Figure 1:
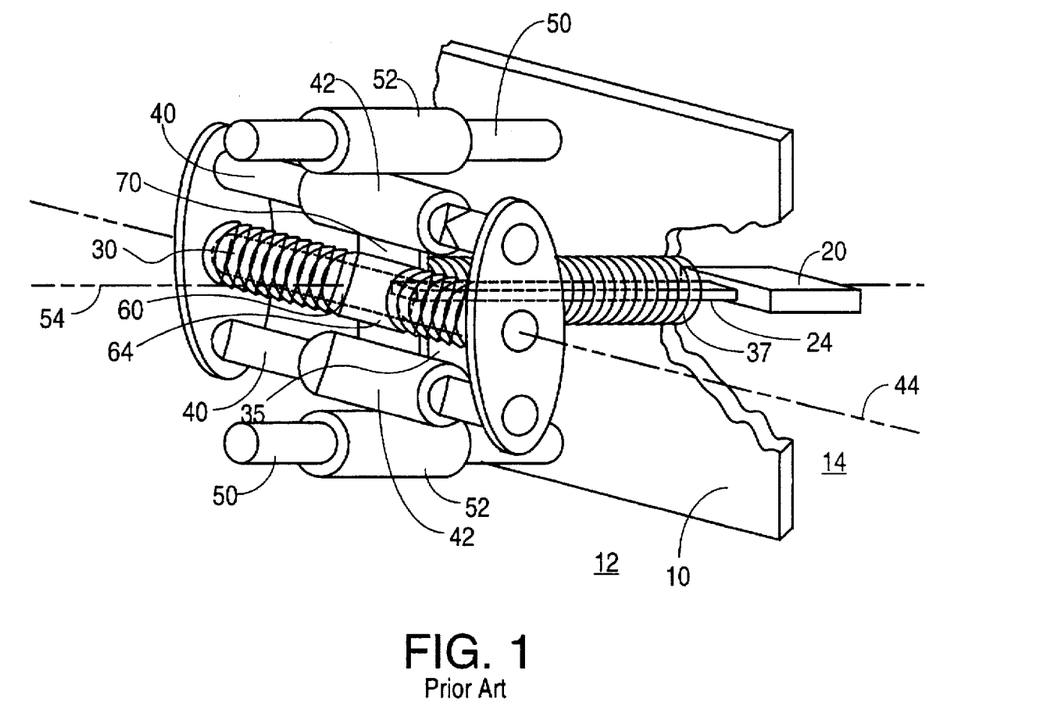
FIG. 1 is a simplified perspective view, partly cut away, of a portion of the stage assembly of the MEBES-4500.

As seen in FIG. 1, linear motion of chuck or payload 20 is provided in a first axis 54 by rods 50 and collars 52, and in a second axis 44, orthogonal to the first axis, by rods 40 and collars 42. Rods 40, 50 and collars 42, 52 are shown on a first side 12 of a vacuum chamber element 10 which is at atmospheric pressure. Payload 20 is shown on a low pressure, second side 14 of element 10. To isolate side 12 from side 14, payload 20 is coupled to shaft 60 via cantilever arm 24 contained within flexible bellows 37. Shaft 60 is contained within flexible bellows 30, 35 and housing 65. Plate 70 couples bellows 37 to housing 65 with cantilever arm 24 passing through an orifice (not shown) within plate 70.

Flexible bellows 37 have an essentially circular cross-section with a diameter sufficiently large to accommodate the full extent of linear motion required along axis 44 and is vacuum coupled at one end to chamber element 10 and at the other end to plate 70. Essentially circular orifices (not shown) with a diameter approximately equal that of bellows 37 are provided in chamber element 10 and plate 70 where coupled to bellows 37. In this manner, linear motion along axis 44 is not restricted while maintaining vacuum within bellows 37 (the vacuum coupling of the ends of flexible bellows 37 is not shown due to the perspective view of FIG. 1). Linear motion along axis 54 is accommodated through the compression or extension of bellows 37.

Thus for an mask patterning system requiring 18 centimeters (cm) of travel in each axis, bellows 37 requires an internal diameter of 18 cm plus the size of arm 24 and design clearances that are deemed necessary and appropriate. Additionally, bellows 37 would have to be capable of expansion and compression of in excess of that same 18 cm. As payload 20 and arm 24 are cantilevered from shaft 60 and through plate 70, they must be as light as possible while still having substantial structural strength, thus materials such as beryllium are employed.

While the design of the MEBES-4500 is proven, and provides high performance, its cost is high. First, it requires the use of bellows fabricated from extremely strong materials, such as stainless steel, to withstand the force of the pressure differential between the low pressure of the exposure chamber and atmosphere. Second, it requires that the payload be cantilevered thus requiring the use of ultra light weight materials in the payload assembly to reduce the mass at the end of the lever. A third problem that results is the mass of the bearing assembly and the stiffness of the bellows material, resulting in a design with a form factor that is approximately six times the stage travel in each direction. In addition, the mass of the design and stiffness of the bellows require considerable force to produce the desired motion requiring the use of oversized force generating devices.

An alternate solution to the massive, stiff bellows required to sustain a one atmosphere pressure differential would be desirable. Thus there exists the need for an alternate solution to providing linear motion to a vacuum system such as the MEBES-4500.

One such solution is proposed in U.S. Pat. No. 4,462,580 entitled "HYDRAULICALLY DRIVEN X-Y STAGE", issued Jul. 31, 1984 to Robert J. Nielsen. Nielsen proposed the use of oil driven hydraulic cylinders to drive the stage. Nielsen discloses that the oil containing portion of the cylinder can be contained within an enclosure comprised in part of bellows, and that this enclosure can be maintained at a pressure less than atmosphere. However, Nielsen provides that the stage is of a cantilever design at the end of rod portion of the hydraulic cylinder. In addition, while Nielsen provides that the oil containing portion is within an enclosure, the rod, as it extends into the working chamber passes through an O-ring seal. As it is known, such seals require lubrication and can create contamination due to friction with the rod. Failure of the O-ring would cause the oil containing enclosure to be exposed to the working chamber resulting in contamination.

SUMMARY

The present invention is directed to a linear motion device that provides for the use of fluid bearings within a vacuum chamber at a first pressure significantly less than one atmosphere. The linear motion device can be used in combination with other such linear motion devices to provide linear motion in two or more directions.

Thus the present invention provides an alternate linear motion device that is truly vacuum compatible by incorporating the fluid bearing in a vacuum enclosure. The vacuum enclosure maintains a second pressure significantly less than one atmosphere but greater than the first pressure, thus allowing the use of light weight, flexible bellows materials such as polyfluorinated hydrocarbons, polyimides and plastics such as polyethylene polymers.

Additionally, having the linear motion device entirely within a vacuum chamber allows for direct, rigid attachment of a moveable payload or chuck to a portion of the fluid bearing. Thus the cantilever attachment of payload employed in the prior art is not required.

The combination of light weight, flexible bellows and the elimination of the requirement of a cantilever design are factors that allow for the design of vacuum compatible dual axis devices that approach the size or form factor of dual axis devices designed for atmospheric operation only.

Finally the present linear motion device, by and through its ability to be completely contained within a vacuum, reduces manufacturing costs while providing enhanced performance for electron beam exposure and mask patterning and other applications.

DETAILED DESCRIPTION

Embodiments of the present invention will be described with reference to the aforementioned figures. It will be understood that these drawings are simplified for ease of understanding and description only. Various modifications will become apparent to those skilled in the art as embodiments of the present invention are described. All such modifications or variations that rely upon the teachings of the present invention, and through which these teachings have advanced the art, are considered to be within the spirit and scope of the present invention.

Figure 2:
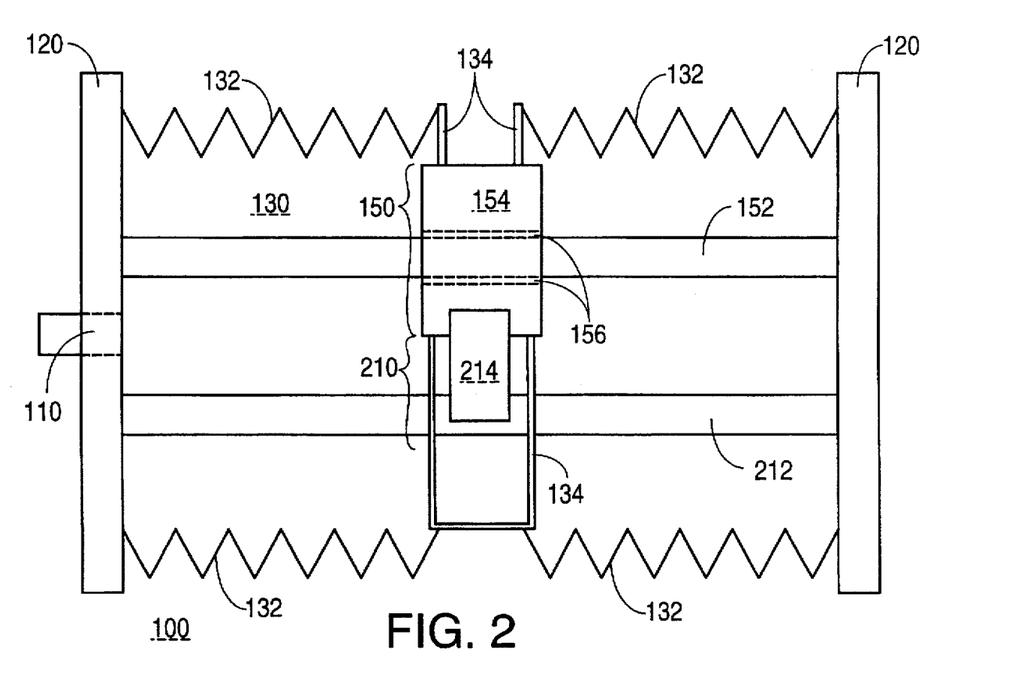
FIG. 2 is a simplified cross-sectional view through a long axis of a linear motion device according to an embodiment of the present invention.

Referring now to FIG. 2, a simplified cross-sectional view along a long axis of a linear motion device 100 according to an embodiment of the present invention is shown. Device 100 is fully contained within a vacuum chamber (not shown) and includes three main assemblies, a vacuum enclosure 130, a fluid bearing 150 and a force generating device (FGD) 210.

Vacuum enclosure 130 includes a pair of flexible bellows 132, a rigid coupling 134 and a pair of rigid mounting plates 120. Each of the pair of flexible bellows 132 is coupled at one end to one of the pair of rigid mounting plates 120 and at another end to rigid coupling 134. A vacuum port 110 provides a means of evacuating enclosure 130 to a pressure below that of atmospheric pressure. Rigid mounting plates 120 are plates specifically designed to provide vacuum closure for ends of bellows 132, and as discussed below, mounting of bearing rod 152. Alternately, mounting plates 120 are interior surfaces of the vacuum chamber within which vacuum enclosure 130 is contained.

Bearing 150 includes a bearing rod 152 fixed at each end to one of the pair of rigid mounting plates 120. A bearing collar 154 is disposed about rod 152 forming a uniform gap 156. Typically, a fluid film (not shown) is supplied under pressure to fill and maintain gap 156 allowing for virtually frictionless movement of bearing collar 154 along the long axis of bearing rod 152. Fluid bearing 150, when supplied with a fluid film under pressure, is often referred to as a hydrostatic fluid film bearing (HFFB). It will be understood by one with skill in the art, that HFFB's are commonly employed, however, other fluid bearings, for example hydrostatic fluid film bearings having a liquid film, where the liquid has a very low vapor pressure for example $1\times10^{-4}$ torr or less, can also be used.

FGD 210 includes a force device stator 212 and a force device slider 214. Force device slider 214 is fixed to bearing collar 154 and is positioned to allow electrical coupling with force device stator 212. Thus an electric current provided to force device slider 214 will cause it to electrically couple to force device stator 212 and a force thus generated is applied to bearing collar 154 resulting in linear motion along the long axis of rod 152. FGD 210 in FIG. 2 is commonly referred to as a linear motor. However, a linear motor is not the only type of device that is employed to impart force to collar 154. For example, a ball screw can be substituted for force device stator 212 and a ball nut can be used in place of force device slider 214. Still other methods, for example hydraulic cylinders, of imparting force to generate relative motion between bearing collar 154 and bearing rod 152 may also be used and are within the scope and spirit of the present invention.

Linear motion device 100, as described, is used, e.g. to provide linear motion in applications such as an electron beam exposure system capable of patterning masks for the semiconductor industry and other applications were linear travel in excess of approximately 7.6 cm is required. In such an application, device 100 is fully contained within a main vacuum chamber of the system. In such systems, a first pressure in the range of approximately $1\times10^{-5}$ to $1\times10^{-7}$ torr is required for the vacuum chamber, however higher pressures, for example as high as approximately $1\times10^{-4}$ torr, or lower pressures, for example as low as approximately $1\times10^{-8}$ torr can be used. To its advantage, device 100 includes, as it has been discussed, vacuum enclosure 130. Vacuum enclosure 130 is maintained at a second pressure, different from the first pressure. For example, enclosure 130 is maintained at a pressure in the range of approximately 10 torr to just above the first pressure. In this manner, the pressure differential between the vacuum chamber and the interior of enclosure 130, and the resulting force is made quite small.

The magnitude of this reduction is best visualized by example. In a prior art system such as the MEBES-4500, the bellows must withstand a pressure differential between the vacuum chamber, at a first pressure of, for example approximately $1\times 10^{-6}$ torr, and one atmosphere. This corresponds to a force in excess of 1 Kg/cm$^2$ and is reason for the requirement found in the MEBES-4500 for bellows fabricated from materials such as stainless steel. On the other hand, device 100 provides vacuum enclosure 130 which can be maintained at a second pressure significantly lower than one atmosphere. Thus with enclosure 130 maintained at a pressure of, for example 0.1 torr, the force applied by the pressure differential is reduced to about 0.14 gm/cm$^2$.

This reduction in force on the bellows allows the selection of materials for bellows 132 that are light in weight and highly flexible, without significant regard for the strength needed to resist the aforementioned large pressure differential of the prior art. Thus highly flexible materials such as polyfluorinated hydrocarbons (Teflon® FEP, Teflon® PFA or Teflon® PTFE (Teflon is a registered trademark of DuPont, Inc.)), polyimides (Kapton® H, Kapton® K, Kapton® HK, Kapton® FN (Kapton is a registered trademark of DuPont, Inc.)) and various plastic materials such as polyethylene polymers are suitable.

Figure 3:
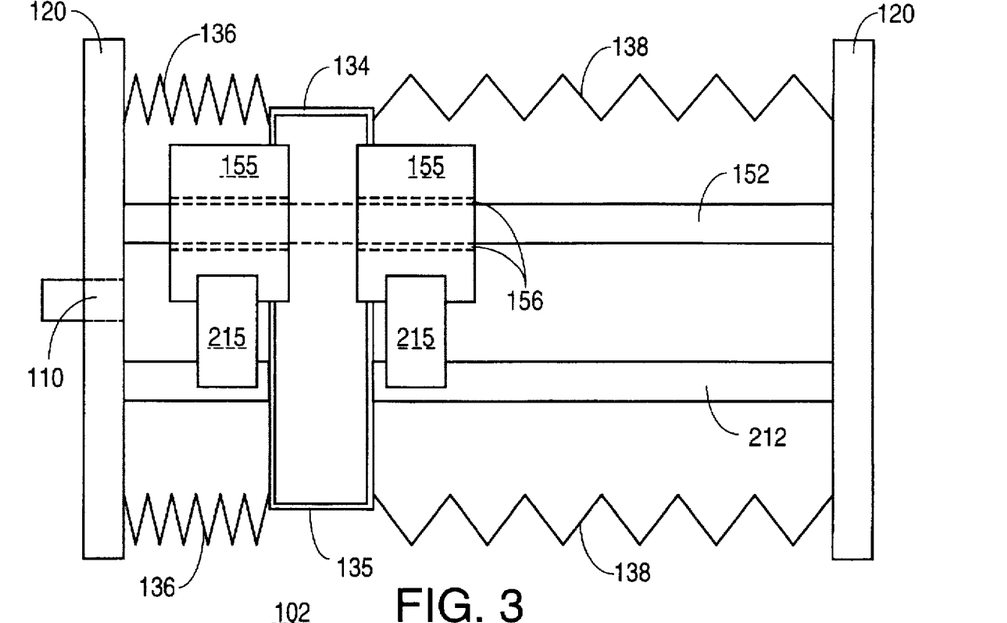
FIG. 3 is a simplified cross-sectional view through a long axis of a linear motion device according to another embodiment of the present invention.

In FIG. 3, another embodiment, linear motion device 102, of the present invention is shown. Bellows 132 of FIG. 2 is shown in FIG. 3 as compressed bellows 136 and extended bellows 138. Additionally, collar 154 of FIG. 2 is shown as a pair of collars 155 and coupling 134 of FIG. 2 is shown as coupling 135 where coupling 135 serves to couple each of collar pair 155 to one another as well as couple compressed bellows 136 to extended bellows 138. Finally, force device slider 214 of FIG. 2 is shown as pair of force device sliders 215.

Figure 4:
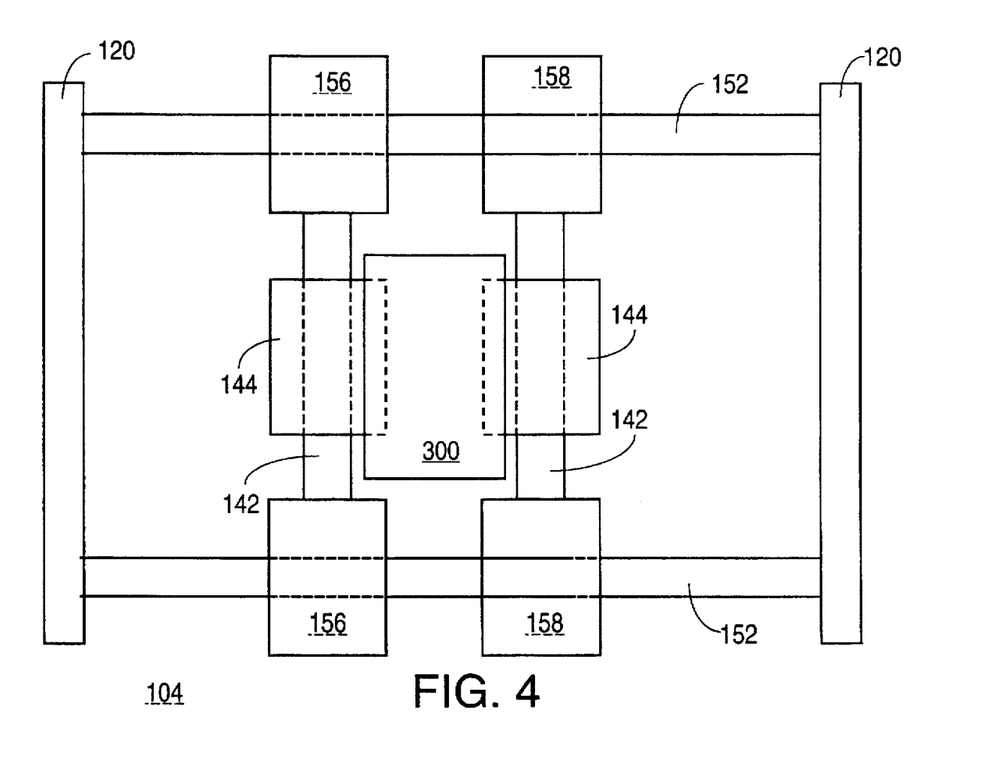
FIG. 4 is a simplified top down view of a dual axis linear motion device according to another embodiment of the present invention.

FIG. 4 is a simplified top down view of a dual axis linear motion device 104 according to another embodiment of the present invention. For ease of illustration and explanation, only motion collars, motion rods, rigid mounting plates 120 and payload 300 are shown. It will be understood, that the embodiment of FIG. 4 is commonly referred to as a X-Y Stage 104 and also encompasses a vacuum enclosure for each rod 152 and collar pair 154 in the manner of the embodiment of FIG. 3, and a vacuum enclosure for each rod 142 and collar 144 in the manner of FIG. 2.

Device or stage 104 includes a pair of motion rods 152 oriented in a first direction, and a pair of motion rods 142, oriented in a second direction, orthogonal to the first direction. Each motion rod 152 is fixably coupled to rigid mounting plates 120 at each end. Thus a rigid, structurally sound mounting basis for device 104 is established through the mounting of rods 152. Additionally, each motion rod 152 has a motion collar 156 and a motion collar 158 disposed thereon in a manner previously described. Each motion rod 142 is fixably coupled between either pair of collars 156 or pair 158. Thus as pairs of collars 156, 158 move in a first direction with respect to a rods 152, motion rods 142 also move in that first direction. Each motion rod 142 has a motion collar 144 disposed thereon in a manner previously described and is fixably coupled to payload 300. Thus, payload 300 can effect linear motion in two orthogonal directions through the relative linear motion of collars 156 and 158 with respect to rods 152 combined with the relative linear motion of collars 144 with respect to rods 142.

It will be understood that payload 300 through its fixable coupling to motion collar 144, is rigidly fixed to mounting plates 120 (FIG. 3). Thus payload 300 is not cantilevered and vibration caused by such a cantilevered structure is eliminated. In addition, while overall system performance can still benefit from lightweight construction of payload 300, elimination of the cantilever design greatly reduces this requirement and allows fabrication of payload 300 from more economical materials.

Another benefit of linear motion device or stage 104 is a reduction in form factor or size. As previously discussed, the MEBES-4500 requires a form factor of six times linear travel in each direction. On the other hand, linear motion device 104 through the use of light weight, highly flexible bellows reduces that form factor to four times linear travel, or less, in each direction. Thus the form factor of stage 104 approaches that of the three times linear travel in each direction found in optical microlithography systems that operate at atmospheric pressure. Additionally, the light weight and flexibility of the bellows materials reduces the amount of force required to produce the desired motion. Both of these benefits greatly enhance overall performance with regard to travel requirements and provide for meeting industry needs well into the future.

Figure 5:
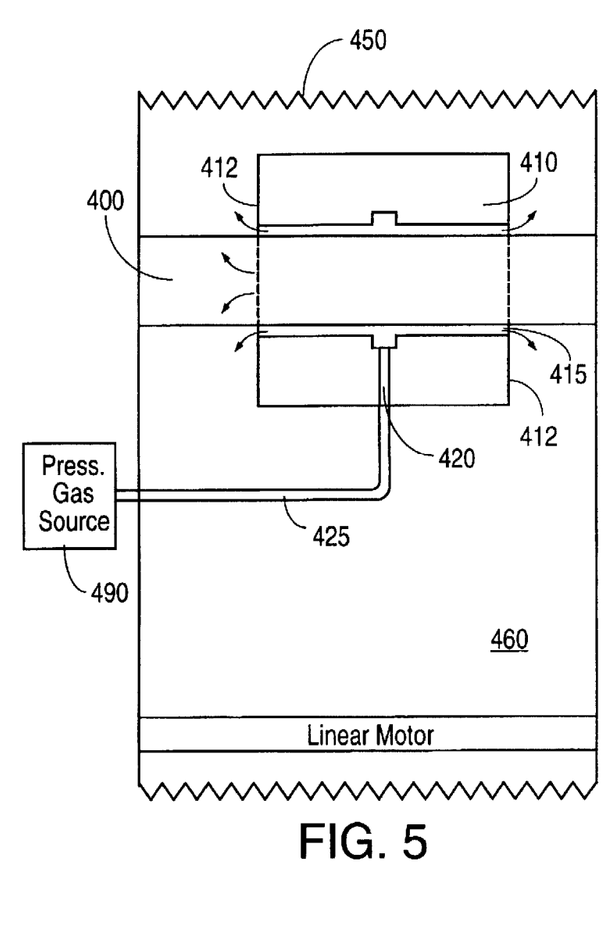
FIG. 5 is a simplified cross sectional view of a collar and a portion of a rod according to an embodiment of the present invention.
Figure 6:
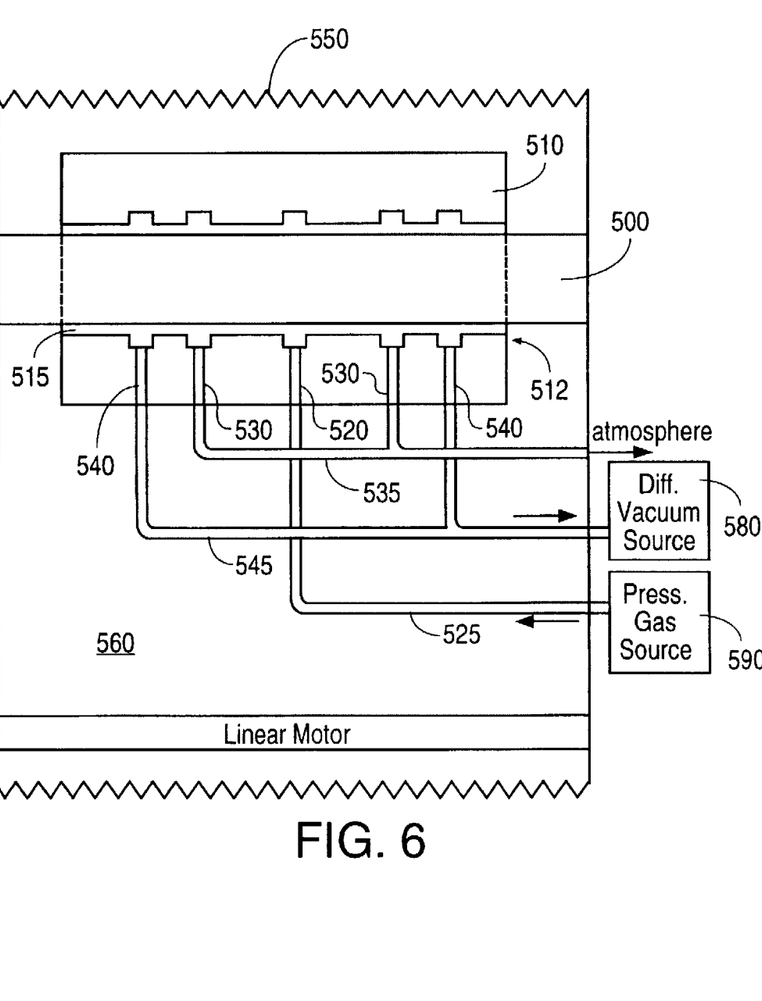
FIG. 6 is a simplified cross sectional view of a collar and a portion of a rod according to another embodiment of the present invention.

Turning now to FIGS. 5 and 6, two alternate embodiments of collars according to the present invention are shown. In FIG. 5, bearing collar 410 is disposed about bearing rod 400 forming uniform gap 415. A portion of flexible bellows 450 coupled at one end to a rigid coupling (not shown) and at another end to a rigid mounting plate (not shown) forming vacuum enclosure 460. Fluid inlet 420 is positioned at approximately a midpoint of collar 410 and is coupled to flexible tube 425 at one end. Flexible tube 425 is also coupled to pressurized gas source 490 at another end. It will be understood that gas source 490 is positioned in a remote location, preferably at atmospheric pressure. Tube 425 supplies a pressurized gas, for example air, to fill gap 415 and maintain a separation of collar 410 and rod 400. In the embodiment of FIG. 5, gas supplied through tube 425 escapes gap 415 at ends 412 of collar 410 into enclosure 460. A vacuum pump (not shown) used to evacuate enclosure 460, is also used to vent this gas to atmosphere to provide for movement of collar 410 over rod 400.

In FIG. 6, an alternate embodiment for venting is depicted. Thus, bearing collar 510 is disposed about bearing rod 500 to form uniform gap 515. A portion of flexible bellows 550 coupled at one end to a rigid coupling (not shown) and at another end to a rigid mounting plate (not shown) are shown to form vacuum enclosure 560. Fluid inlet 520 is positioned at approximately a midpoint of collar 510 and is coupled to flexible tube 525 at one end. Flexible tube 525 is also coupled to pressurized gas source 590 at another end. A pair of first venting ports 530 are positioned on either side of inlet 520 and a pair of second venting ports 540 are positioned between each first port 530 and end 512 of collar 510. Second ports 540 are coupled to differential vacuum source 580 through flexible vacuum tubing 545. First ports 530 are coupled to atmosphere through flexible tubing 535. Flexible tubing 525 and 545 taken in combination with flexible vacuum tubing 535 is commonly referred as a service loop. Thus, as one skilled in the art knows, a differentially vented bearing collar is provided where a gas supplied through inlet 520 is vented before it can reach enclosure 560.

As it is known, HFFB's are fabricated in a variety of configurations; these are compatible with embodiments of the present invention. These alternate configurations when combined with the disclosure presented herein are deemed to be within the spirit and scope of the present invention. For example, an HFFB configured to use a low vapor pressure liquid as a bearing support fluid, or configurations that employ differing venting configurations are deemed to be within the scope and spirit of the present invention.

Figure 7:
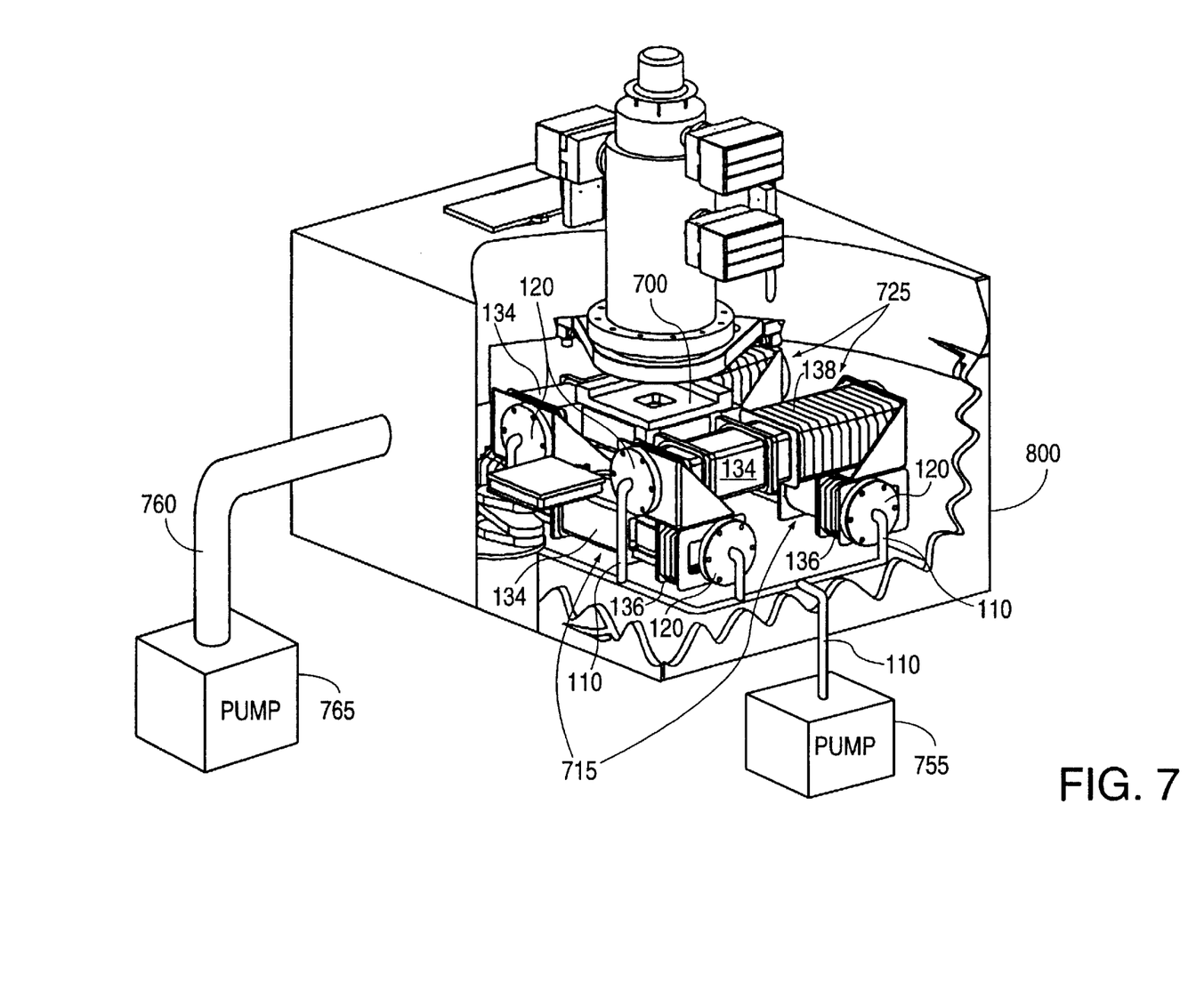
FIG. 7 is a simplified perspective view with cut out portions of an embodiment of the present invention.

Referring now to FIG. 7, a simplified perspective view, with cut-out portions, of an embodiment of the present invention within an electron beam mask patterning system is shown. Payload or chuck 700 is shown contained within vacuum chamber 800 fixably coupled to first pair of linear motion devices (not shown), oriented in a first direction and wholly contained within first pair of vacuum enclosures 715. While not entirely visible due to the perspective of FIG. 7, each first vacuum enclosure 715 is represented as having a compressed bellows portion 136, an expanded bellows portion 138 and coupling 135 (see, FIG. 3).

The above mentioned first motion devices not shown are fixably coupled to a second pair of linear motion devices not shown, oriented in a second direction orthogonal to the first direction and wholly contained within second vacuum enclosures 725. While not fully visible due to the perspective of FIG. 7, each second vacuum enclosure 725, described for each first vacuum enclosure 175, is represented as having a compressed bellows portion 136, an expanded bellows portion 138 and coupling 135 (see, FIG. 3). Thus linear motion in two orthogonal axes is provided for chuck 700 within vacuum chamber 800 through first and second motion devices.

As described with respect to FIG. 4 first and, second pair of linear motion devices not shown are fixably mounted through rigid mounting plates 120 at ends of each first and second vacuum enclosures 715 and 725 respectively to vacuum chamber 800. In this manner, providing for a rigid, stable mounting of first pair of linear motion devices and payload 700. Thus mounting of payload or chuck 700 does not require a cantilever design and enhanced stability is achieved to provide enhanced performance.

Vacuum chamber 800 is evacuated to the first pressure through vacuum coupling 760 to vacuum pump 765. First and second vacuum enclosures 715, 725 are evacuated to the second pressure through vacuum couplings 110 to vacuum pump 755. Thus a reduced pressure differential, as previously discussed, is obtained. This reduced differential then allows the use of lighter, more flexible bellows materials for bellows 136 and 138 and when combined with the rigid fixed mounting within vacuum chamber 800, also results in a smaller form factor for the overall design.

Thus a new, vacuum compatible linear motion device has been disclosed. The new linear motion device provides for a rigid mounting of a payload, for example to form an X-Y motion stage, while entirely contained within a vacuum chamber thus eliminating the need for designs incorporating cantilevers. The new device additionally provides for use of hydrostatic fluid film bearings within vacuum enclosures that are maintained at a pressure between atmosphere and the pressure of the vacuum chamber. This feature allows for the use of lightweight, flexible bellows materials thus reducing the mass of designs as compared to the prior art where relatively inflexible materials, such as stainless steel, are required. This reduction in mass, due in part to the bellows, makes possible stage designs that have a reduced form factor or size than currently required. Thus form factors approaching those of atmospheric designs are possible. Finally, all of the aforementioned improvements combine to result in greatly reduced cost to manufacture while also providing for enhanced performance.

We claim:

1. A vacuum compatible linear motion device comprising:
   a vacuum chamber for sustaining a first pressure substantially less than one atmosphere;
   a first fluid bearing fixably coupled to an inside surface of said vacuum chamber wherein said first fluid bearing has an axis oriented in a first direction;
   a first enclosure, wherein said first enclosure encloses said fluid bearing and is within the vacuum chamber, such that a second pressure substantially less than one atmosphere and greater than the first pressure is maintained within said first enclosure; and
   a payload within said vacuum chamber wherein said payload is fixably coupled to said first fluid bearing whereby linear motion is provided for said payload.

2. The vacuum compatible linear motion device of claim 1 wherein said payload has a range of linear motion in said first direction of at least approximately 7.6 cm.

3. The vacuum compatible linear motion device of claim 2 wherein said payload is free to move linearly in said first direction with straightness of travel in pitch, roll and yaw of less than approximately 2 arc-seconds and vibration of less than 1/1000 gravity.

4. The vacuum compatible linear motion device of claim 1 wherein said first fluid bearing is a hydrostatic fluid film bearing comprising:
   a first rod fixably coupled to said vacuum chamber;
   a first collar disposed about a portion of said first rod and fixably coupled to said payload wherein said first collar provides linear motion along the first direction with respect to said first rod; and
   a bearing support fluid disposed between said first collar and said first rod.

5. The vacuum compatible linear motion device of claim 4 wherein said first rod further comprises first and second ends wherein said first and second ends are fixably coupled to said vacuum chamber.

6. The vacuum compatible linear motion device of claim 1 wherein said first enclosure is comprised of a bellows fabricated from a flexible polyfluorinated hydrocarbon material or a flexible polyimide material.

7. The vacuum compatible linear motion device of claim 1 wherein said first enclosure is comprised of a bellows fabricated from a flexible polyethylene material.

8. The vacuum compatible linear motion device of claim 4 further comprising a force generating device coupled to said first fluid bearing wherein said force generating device provides force for moving said first collar with respect to said first rod.

9. The vacuum compatible linear motion device of claim 8 wherein said force generating device is enclosed within said first enclosure.

10. The vacuum compatible linear motion device of claim 9 wherein said force generating device is a linear motor.

11. The vacuum compatible linear motion device of claim 4 wherein said bearing support fluid is comprised of air.

12. The vacuum compatible linear motion device of claim 4 wherein said bearing support fluid is a liquid having a vapor pressure below approximately $1 \times 10^{-4}$ torr.

13. The vacuum compatible linear motion device of claim 4 wherein said bearing support fluid is supplied to said first collar through flexible tubing coupled to said first collar.

14. The vacuum compatible linear motion device of claim 13 wherein said bearing support fluid is vented within said first enclosure.

15. The vacuum compatible linear motion device of claim 4 said first collar further comprising:

a fluid supply portion disposed at a midpoint of said first collar;

a first pair of venting portions disposed symmetrically about said fluid supply portion;

a second pair of venting portions disposed symmetrically about said first pair of venting portions; and a service loop comprising flexible tube connections to said fluid supply portion and said first and second pair of venting portions, wherein each of said first venting portions is coupled to a vacuum source having a pressure greater than said second pressure and less than atmospheric pressure and each of said second venting portions is coupled to atmospheric pressure, and wherein said bearing support fluid is vented through each of said first and second venting portions.

16. The vacuum compatible linear motion device of claim 1 further comprising:

a first vacuum pumping device for maintaining said vacuum chamber at the first pressure; and a second vacuum pumping device for maintaining said first enclosure at the second pressure.

17. The vacuum compatible linear motion device of claim 1 further comprising:

a second fluid bearing oriented in a second direction orthogonal to said first direction, wherein said second fluid bearing is fixably coupled to said first fluid bearing and wherein said payload's fixable coupling to said first fluid bearing is through said second fluid bearing, whereby linear motion is provided for said payload in said second direction; and a second enclosure wherein said vacuum enclosure encloses said second fluid bearing and maintains a second pressure substantially less than atmospheric pressure and higher than the first pressure.

18. The vacuum compatible linear motion device of claim 17 wherein said payload has a range of linear motion in said first and second directions of at least approximately 7.6 cm with straightness of travel in pitch, roll and yaw of less than approximately 2 arc second and vibration of less than $1/1000$ gravity.

19. The vacuum compatible linear motion device of claim 17 wherein said first enclosure and said second enclosure are comprised of a bellows fabricated from a flexible polyfluorinated hydrocarbon material or a polyimide material.

20. The vacuum compatible linear motion device of claim 17 wherein said first enclosure and said second enclosure are comprised of a bellows fabricated from a polyethylene material.

21. The vacuum compatible linear motion device of claim 17 further comprising:

a first force generating device for providing force for moving said first collar; and a second force generating device for providing force for moving said second collar;

wherein said first force generating device is enclosed within said first enclosure and said second force generating device is enclosed within said second enclosure.

22. The vacuum compatible linear motion device of claim 21 wherein said first and second force generating devices are linear motors.

23. The vacuum compatible linear motion device of claim 17 wherein said first fluid bearing is a hydrostatic fluid film bearing comprising:

a first rod coupled to said vacuum chamber;

a first collar disposed about a portion of said first rod wherein said first collar provides linear motion along the first direction with respect to said first rod; and said second fluid bearing is a hydrostatic fluid film bearing comprising:

a second rod coupled to said first collar;

a second collar disposed about a portion of said second rod wherein said second collar provides linear motion along the second direction with respect to said second rod, and wherein said second collar is fixably coupled to said payload; and a bearing support fluid disposed between said first collar and said first rod and between said second collar and said second rod respectively;

whereby the fixable coupling of said payload to said first fluid bearing is through said second fluid bearing.

24. The vacuum compatible linear motion device of claim 23 wherein said first fluid bearing, said second fluid bearing and said payload comprise a stage having a form factor of no more than approximately 3 times linear travel in the first and second directions.

25. The vacuum compatible linear motion device of claim 23 wherein said bearing support fluid is comprised of a gas or a liquid having a vapor pressure below approximately $1 \times 10^{-4}$ torr.

26. The vacuum compatible linear motion device of claim 23 wherein said bearing support fluid is supplied to said first and second collars through flexible tubing coupled to said first and second collars respectively and wherein said bearing support fluid is vented within said first and second enclosures respectively.

27. The vacuum compatible linear motion device of claim 23, each of said first and second collars further comprising:

a fluid supply portion disposed at a midpoint of said each collar;

a first pair of venting portions disposed symmetrically about said fluid supply portion;

a second pair of venting portions disposed symmetrically about said first pair of venting portions; and a service loop comprising flexible tube connections to said fluid supply portion and said first and second pair of venting portions, wherein each of said first venting portions is coupled to a vacuum source having a pressure greater than said second pressure and less than atmospheric pressure and each of said second venting portions is coupled to atmospheric pressure, and wherein said bearing support fluid is vented through each of said first and second venting portions.

28. A dual axis linear motion device contained within a vacuum chamber comprising:

a first bearing rod oriented with a long axis in a first direction wherein said first bearing rod is fixably coupled to more than one surface of said vacuum chamber;

a first bearing collar movably coupled to said first bearing rod;

a second bearing rod oriented with a long axis in a second direction, wherein the second direction is perpendicular to the first direction;

a second bearing collar movably coupled to said second bearing rod and fixably coupled to said first bearing rod;

a payload fixably coupled to said first bearing collar;

a fluid disposed between said first and second bearing collars and said first and second bearing rods respectively;

an apparatus for providing said fluid;

a first enclosure disposed about said first bearing rod and fixably coupled to said first bearing collar and said second bearing collar;

a second enclosure disposed about said second bearing rod and fixably coupled to said second bearing collar and to a ground portion within said vacuum chamber;

a first force generating device wherein said first force generating device provides force for linear motion of said first bearing collar with respect to said first bearing rod;

a second force generating device wherein said second force generating device provides force for linear motion of said second bearing collar with respect to said second bearing rod;

a first vacuum pump for maintaining said vacuum chamber at a first pressure less than approximately $1 \times 10^{-5}$ torr; and a second vacuum pump for maintaining said first and second enclosures at a second pressure of less than approximately 10 torr;

said payload being free to move linearly in said first direction and/or said second direction with straightness of travel in pitch, roll and yaw of less than approximately 2 arc second and vibration of less than $1/1000$ gravity.

29. The dual axis linear motion device contained within a vacuum chamber of claim 28 wherein said first force generating device is enclosed within said first enclosure and said second force generating device is enclosed within said second enclosure.

30. The dual axis linear motion device contained within a vacuum chamber of claim 28 wherein said first and second force generating devices are linear motors.

31. The dual axis linear motion device contained within a vacuum chamber of claim 28 wherein said fluid is comprised of air.

32. The dual axis linear motion device contained within a vacuum chamber of claim 28 wherein said apparatus for providing said fluid comprises vacuum compatible flexible tubing.

33. The dual axis linear motion device contained within a vacuum chamber of claim 28 wherein said fluid disposed between said first and second collars and said first and second rods respectively is vented within said first and second enclosure respectively.

34. The dual axis linear motion device contained within a vacuum chamber of claim 28 having a form factor of no more than approximately 3 times linear travel in the first and second directions.

35. An electron beam exposure system comprising:

a vacuum chamber for performing electron beam exposure at a first vacuum less than approximately $1 \times^{-5}$ torr;

a first linear motion device rigidly mounted within said vacuum chamber and oriented having a long axis in a first direction, wherein said first linear motion device further comprises a first hydrostatic fluid film bearing contained within a first enclosure for sustaining a second vacuum less than approximately 10 torr;

a second linear motion device fixably coupled to said first linear motion device within said vacuum chamber and oriented having a long axis in a second direction orthogonal to the first direction, wherein said second linear motion device further comprises a second hydrostatic fluid film bearing contained within a second enclosure for sustaining a second vacuum less than approximately 10 torr; and a payload fixably coupled to said second linear motion device whereby dual axis linear motion for said payload is provided.

36. The electron beam exposure system of claim 35 wherein said payload has a range of linear motion in both the first and second direction of at least 7.6 cm and wherein the range of linear motion has a straightness of travel in pitch, roll and yaw of less than approximately 2 arc sec and vibration of less than $1/1000$ gravity.

37. The electron beam exposure system of claim 35 wherein the first and second fluid bearing are differentially vented.

38. The electron beam exposure system of claim 35 wherein the first and second linear motion devices are entirely contained within said vacuum chamber.

39. The electron beam exposure system of claim 35 said first and second enclosures further comprising a bellows portion.

40. The electron beam exposure system of claim 39 wherein said bellows portion comprises flexible polyfluorinated hydrocarbon material or flexible polyimide material.

41. The electron beam exposure system of claim 39 wherein said bellows portion comprises flexible polyethylene material.

42. The electron beam exposure system of claim 39 wherein said first linear motion device, said second linear motion device and said payload comprise a stage having a form factor of no more than approximately 3 times linear travel in the first and second directions.

* * * * *